United States Patent
Huh et al.

(10) Patent No.: US 10,211,427 B2
(45) Date of Patent: Feb. 19, 2019

(54) DISPLAY DEVICE AND APPARATUS AND METHOD FOR MANUFACTURING THE SAME

(71) Applicant: SAMSUNG DISPLAY CO., LTD., Yongin-si, Gyeonggi-do (KR)

(72) Inventors: Myungsoo Huh, Yongin-si (KR); Sunghun Key, Yongin-si (KR); Sungchul Kim, Yongin-si (KR); Cheollae Roh, Yongin-si (KR); Sukwon Jung, Yongin-si (KR); Hyunwoo Joo, Yongin-si (KR); Jaihyuk Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/640,945

(22) Filed: Jul. 3, 2017

(65) Prior Publication Data
US 2017/0309864 A1    Oct. 26, 2017

Related U.S. Application Data

(62) Division of application No. 14/811,729, filed on Jul. 28, 2015, now Pat. No. 9,722,206.

(30) Foreign Application Priority Data

Nov. 11, 2014    (KR) .................... 10-2014-0156236

(51) Int. Cl.
*H01L 51/52*    (2006.01)
*H01J 37/32*    (2006.01)
(Continued)

(52) U.S. Cl.
CPC ........ *H01L 51/5256* (2013.01); *C23C 16/042* (2013.01); *C23C 16/345* (2013.01);
(Continued)

(58) Field of Classification Search
CPC ............... C23C 16/042; C23C 16/345; C23C 16/45565; C23C 16/505; F27D 11/02;
(Continued)

(56) References Cited

U.S. PATENT DOCUMENTS

| 4,441,973 A * | 4/1984 | Noguchi | ............. C23C 14/0021 136/258 |
| 7,671,364 B2 * | 3/2010 | Lee | ................... G02F 1/133305 257/59 |

(Continued)

FOREIGN PATENT DOCUMENTS

| JP | 9-129627 A | 5/1997 |
| JP | 2003-239071 A | 8/2003 |

(Continued)

OTHER PUBLICATIONS

EPO Search Report dated Mar. 10, 2016, for corresponding European Patent application 15193834.7, (7 pages).

(Continued)

*Primary Examiner* — Mohammed Shamsuzzaman
(74) *Attorney, Agent, or Firm* — Lewis Roca Rothgerber Christie LLP

(57) ABSTRACT

A display device and an apparatus and method for manufacturing the same are disclosed. The display device includes: a substrate; a display unit formed on the substrate; and an inorganic layer formed on the display unit, wherein a water vapor transmission rate (WVTR) of the inorganic layer is $5 \times 10^{-5}$ g/m² day or less. The apparatus for manufacturing a display device includes: a chamber; a shower head for spraying a mixed gas into the chamber; a plasma generation unit for forming plasma from the mixed gas; a susceptor facing the shower head and on which a substrate is seated; and a power supply unit electrically connected to the plasma generation unit, wherein a frequency of a current (Continued)

supplied from the power supply unit to the plasma generation unit is between about 27 MHz and about 42 MHz.

10 Claims, 4 Drawing Sheets

(51) Int. Cl.
- *C23C 16/04* (2006.01)
- *C23C 16/34* (2006.01)
- *C23C 16/455* (2006.01)
- *C23C 16/505* (2006.01)

(52) U.S. Cl.
CPC ...... *C23C 16/45565* (2013.01); *C23C 16/505* (2013.01); *H01J 37/3244* (2013.01); *H01J 37/32091* (2013.01)

(58) Field of Classification Search
CPC ............ H01J 37/32091; H01J 37/3244; H01L 51/5256; H05B 3/0028
USPC ............ 257/100; 427/69; 428/447; 313/512, 313/504
See application file for complete search history.

(56) References Cited

U.S. PATENT DOCUMENTS

| | | | |
|---|---|---|---|
| 2003/0086041 A1* | 5/2003 | Watanabe | G02F 1/136227 349/122 |
| 2003/0203210 A1 | 10/2003 | Graff et al. | |
| 2004/0113542 A1 | 6/2004 | Hsiao et al. | |
| 2004/0241920 A1 | 12/2004 | Hsiao et al. | |
| 2005/0167805 A1 | 8/2005 | Usami | |
| 2006/0216951 A1 | 9/2006 | Moro et al. | |
| 2007/0090457 A1* | 4/2007 | Lee | G02F 1/133305 257/347 |
| 2007/0184181 A1* | 8/2007 | Wada | C23C 16/345 427/69 |
| 2007/0243386 A1 | 10/2007 | Park et al. | |
| 2009/0051272 A1* | 2/2009 | Fukuda | B32B 15/08 313/504 |
| 2009/0197101 A1* | 8/2009 | Nakagame | C23C 16/345 428/447 |
| 2009/0218943 A1* | 9/2009 | Nishimura | H01L 51/5275 313/512 |
| 2010/0187986 A1 | 7/2010 | Kajitani et al. | |
| 2011/0064932 A1* | 3/2011 | Takahashi | C23C 16/345 428/220 |
| 2011/0121271 A1 | 5/2011 | Jeon et al. | |
| 2013/0040102 A1 | 2/2013 | Gleason et al. | |
| 2015/0364720 A1* | 12/2015 | Itoh | B32B 27/06 428/446 |
| 2016/0036000 A1* | 2/2016 | Choi | H01L 51/56 257/40 |
| 2016/0108282 A1* | 4/2016 | Ito | B32B 15/08 428/446 |

FOREIGN PATENT DOCUMENTS

| | | |
|---|---|---|
| JP | 2005-222994 A | 8/2005 |
| KR | 10-2009-0014417 A | 2/2009 |
| WO | WO 2009/099009 A1 | 8/2009 |

OTHER PUBLICATIONS

English machine translation of relevant parts (p. 8, paragraphs 0036 and 0037) of International Publication WO 2009/099009 dated Aug. 13, 2009, (2 pages).

EPO Office Action dated Jun. 20, 2018, for corresponding European Application No. 15193834.7 (7 pages).

* cited by examiner

DISPLAY DEVICE AND APPARATUS AND METHOD FOR MANUFACTURING THE SAME

CROSS-REFERENCE TO RELATED APPLICATION

This application is a divisional of U.S. patent application Ser. No. 14/811,729, filed Jul. 28, 2015, which claims priority to and the benefit of Korean Patent Application No. 10-2014-0156236, filed on Nov. 11, 2014, the entire contents of both of which are incorporated herein by reference.

BACKGROUND

1. Field

One or more exemplary embodiments relate to a display device, an apparatus for manufacturing a display device, and a method of manufacturing a display device.

2. Description of the Related Art

Mobile electronic devices have become increasingly popular in recent years. Handheld electronic devices, such as mobile phones and tablet personal computers (PCs), for example, are widely used.

These mobile electronic devices typically include a display device for providing visual information, such as an image or a video, to a user. Recently, while the need has developed to miniaturize parts for driving a display device, the weight of the display part in an electronic device has gradually increased. Also, a structure capable of bending a generally flat display device at a predetermined angle has been developed.

SUMMARY

One or more exemplary embodiments include a display device and an apparatus and method of manufacturing the display device.

Additional aspects of the present invention are set forth in part in the description which follows and, in part, are apparent from the description, or may be learned by practice of the presented embodiments.

According to one or more exemplary embodiments, a display device includes: a substrate; a display unit formed on the substrate; and an inorganic layer formed on the display unit, wherein a water vapor transmission rate (WVTR) of the inorganic layer is $5 \times 10^{-5}$ g/m$^2$ day or less.

A refractive index of the inorganic layer may be between about 1.8 and about 1.88.

A transmission rate of the inorganic layer at 450 nm may be about 90% or greater.

A stress of the inorganic layer may be between about −200 MPa and about 200 MPa.

A bond ratio of silicon (Si)-nitride (N) in the inorganic layer may be about 60% or greater, and a bond ratio of Si-hydrogen (H) may be about 30% or less.

According to one or more exemplary embodiments, an apparatus for manufacturing a display device includes: a chamber; a shower head for spraying a mixed gas into the chamber; a plasma generation unit for forming plasma from the mixed gas; a susceptor facing the shower head and on which a substrate is seated; and a power supply unit electrically connected to the plasma generation unit, wherein a frequency of a current supplied from the power supply unit to the plasma generation unit is between about 27 MHz and about 42 MHz.

A temperature of the substrate may be maintained at about 100° C. or less.

A partial pressure ratio of silane in the mixed gas may be between about 30% and about 80%.

According to one or more exemplary embodiments, a method of manufacturing a display device includes: forming a display unit on a substrate; seating and aligning the substrate on a susceptor inside a chamber; and forming an inorganic layer on the display unit by spraying a plasma mixed gas onto the display unit through a shower head, wherein the shower head includes a plasma generation unit for forming plasma from the mixed gas, and a frequency of a current of power supplied to the plasma generation unit is between about 27 MHz and about 42 MHz.

A water vapor transmission rate (WVTR) of the inorganic layer may be $5 \times 10^{-5}$ g/m$^2$ day or less.

A partial pressure ratio of silane in the mixed gas may be between about 30% and about 80%.

A temperature of the substrate may be maintained at about 100° C. or less.

A deposition speed of the inorganic layer may be about 0.45 µm/min or greater.

A refractive index of the inorganic layer may be between about 1.8 and about 1.88.

A transmission rate of the inorganic layer at 450 nm may be about 90% or greater.

A stress of the inorganic layer may be between about −200 MPa and about 200 MPa.

A bond ratio of silicon (Si)-nitride (N) in the inorganic layer may be about 60% or greater, and a bond ratio of Si-hydrogen (H) may be about 30% or less.

The method may further include forming an organic layer on the inorganic layer.

The forming of the inorganic layer and the forming of the organic layer may be repeatedly performed to form alternating layers.

These general and specific embodiments may be implemented by using a system, a method, a computer program, or a combination of the system, the method, and the computer program.

BRIEF DESCRIPTION OF THE DRAWINGS

These and/or other aspects will become apparent and more readily appreciated from the following description of exemplary embodiments, taken in conjunction with the accompanying drawings in which.

DETAILED DESCRIPTION

Figure 1:
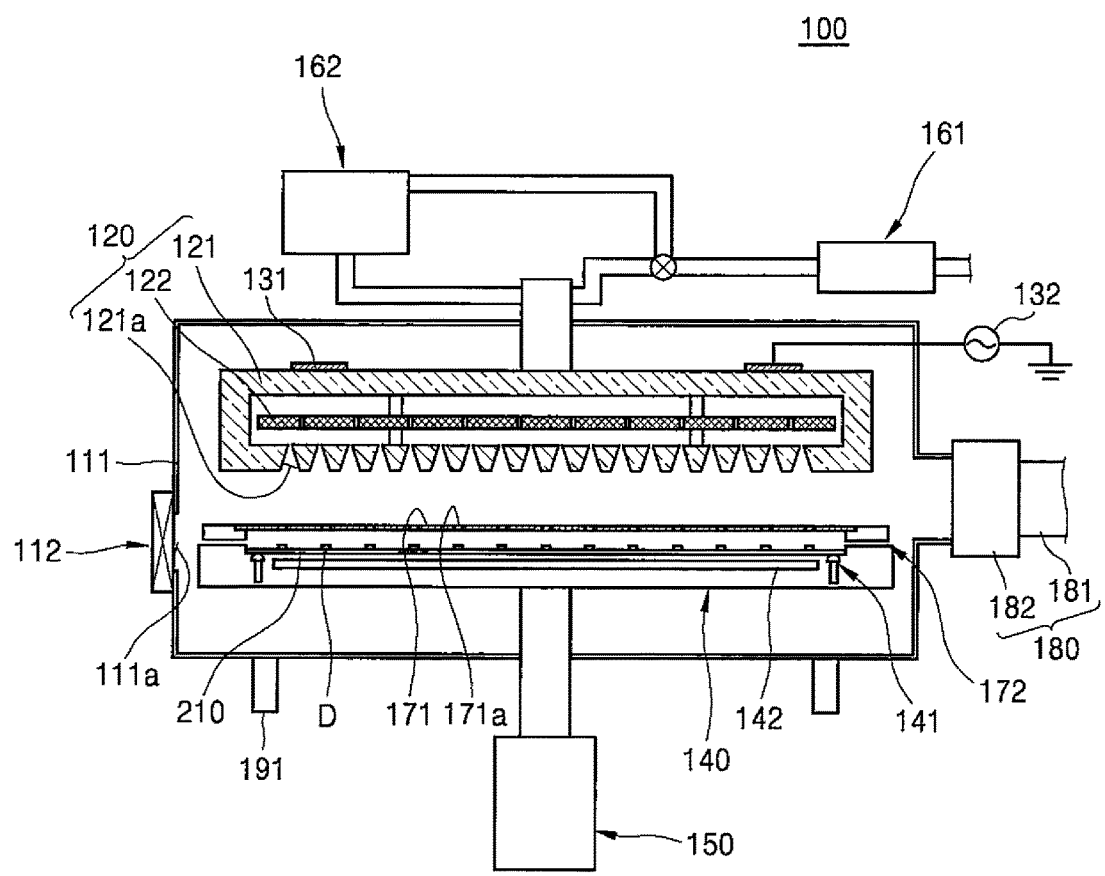
FIG. 1 is a schematic view of an apparatus for manufacturing a display device according to one or more embodiments of the present invention.

Hereinafter, exemplary embodiments of the present invention are described, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present invention.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

As used herein, the term "existing apparatus" refers to a standard apparatus for forming a display device as is typical in the prior art. Similarly, the term "existing process" refers to a standard process of manufacturing a display device as is typical in the prior art, i.e., a process according to an existing apparatus. The term "existing display device" similarly refers to a display device that is typical in the prior art, for example, a display device that is manufactured according to an existing process or an existing apparatus.

Figure 2:
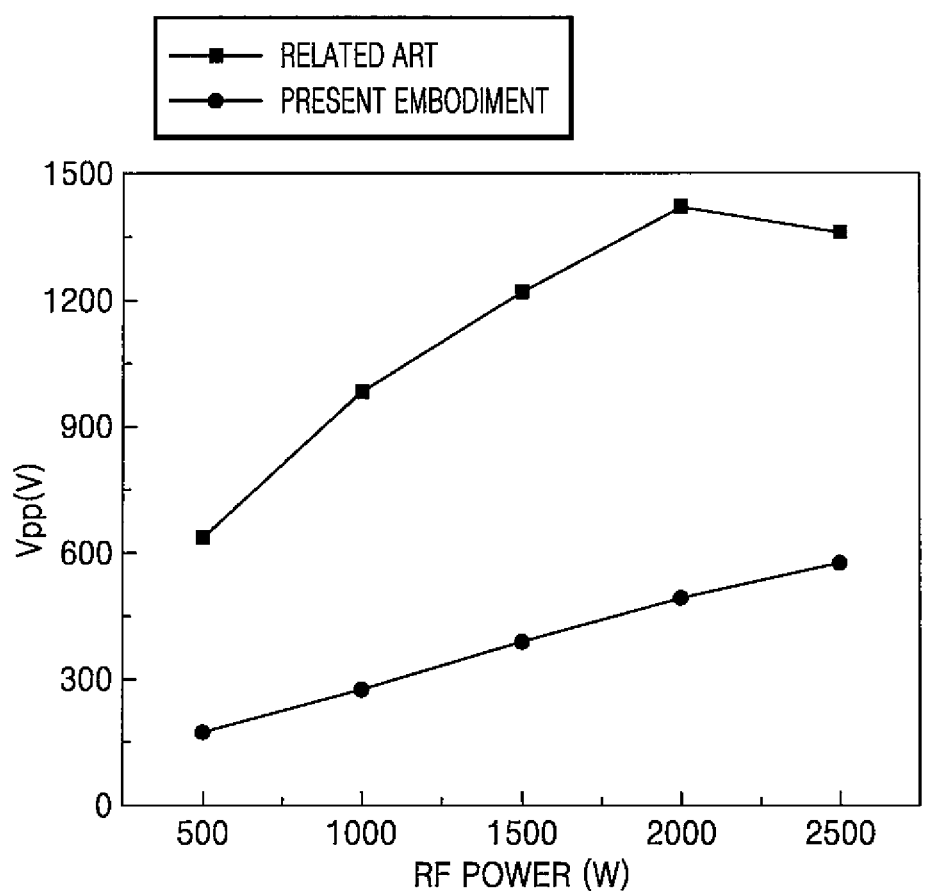
FIG. 2 is a graph comparing a plasma potential difference of the apparatus of FIG. 1 with that of an existing apparatus.

FIG. 1 is a schematic view of an apparatus 100 for manufacturing a display device according to one or more embodiments of the present invention. FIG. 2 is a graph comparing a plasma potential difference of the apparatus 100 of FIG. 1 with that of an existing apparatus.

Referring to FIGS. 1 and 2, the apparatus 100 may include a chamber 111, a shower head 120, a plasma generation unit 131, a power supply unit 132, a susceptor 140, a driving unit 150, a gas supply unit 161, a cleaning unit 162, a mask 171, a mask fixing unit 172, a vision unit 191, an exhaust unit 180, and a control unit.

The chamber 111 may have a space therein and may include an opening 111a through which a substrate 210 may be inserted or withdrawn. A gate valve 112 may be installed at the opening 111a such that the gate valve 112 opens or closes the opening 111a.

The shower head 120 may be located inside the chamber 111. The shower head 120 may include a shower head body 121 having a space therein and a baffle 122 located inside the shower head body 121.

The shower head body 121 may have at least one spray hole 121a. The shower head body 121 may be connected to the gas supply unit 161 that supplies a mixed gas to the shower head body 121. The mixed gas is then sprayed inside of the chamber 111 through the at least one spray hole 121a.

The baffle 122 may partition the space inside the shower head body 121. The baffle 122 may supply the mixed gas supplied from the gas supply unit 161 to the at least one spray hole 121a at a uniform pressure.

The mixed gas may be formed in various ways. For example, the mixed gas may include a reaction gas and an inert gas. In one or more embodiments, the reaction gas may include a silicon precursor such as silane ($SiH_4$) or the like, and the inert gas may include a helium (He) gas or the like. The inert gas may be used as a purge gas or a carrier gas.

The reaction gas and the inert gas may be supplied to the shower head body 121 separately. As such, the reaction gas and the inert gas may be mixed inside the shower head body 121 and sprayed into the chamber 111. In other embodiments, the reaction gas and the inert gas may be sprayed from the shower head body 121 into the chamber 111 separately and mixed inside the chamber 111. However, for convenience of description, reference is made herein to embodiments wherein the reaction gas and the inert gas are mixed inside the shower head body 121 and sprayed into the chamber 111.

The plasma generation unit 131 may be mounted inside the chamber 111 to generate plasma from the mixed gas. According to one or more embodiments, the plasma generation unit 131 may have an electrode form mounted on the shower head 120. Alternatively, in other embodiments, the plasma generation unit 131 may form a potential difference between the susceptor 140 and an outer wall of the chamber 111 or between the shower head 120 and the susceptor 140. As such, the plasma generation unit 131 may have a cable form connected to each of the susceptor 140 and the chamber 111 or connected to each of the shower head 120 and the susceptor 140.

The plasma generation unit 131 is not limited thereto and may include any device and any structure capable of generating plasma from the mixed gas. However, for convenience of description, reference is made herein to embodiments wherein the plasma generation unit 131 has an electrode form mounted on the shower head 120.

The power supply unit 132 may supply a current to the plasma generation unit 131. The power supply unit 132 may include a high-frequency power supply. A frequency of the current supplied from the power supply unit 132 to the plasma generation unit 131 may be controlled (or maintained at a specified frequency). For example, the frequency of the current supplied from the power supply unit 132 to the plasma generation unit 131 may be between about 27 MHz and about 42 MHz.

The susceptor 140 may be formed such that a substrate 210 is seated on the susceptor 140. The susceptor 140 may include a temperature control unit 142 for controlling a temperature of the substrate 210. The temperature control unit 142 may include at least one of a cooling unit and a heater unit.

The susceptor 140 may include a lifter 141 for linearly moving the substrate 210. As such, the lifter 141 may adjust a gap between the substrate 210 and the mask 171 by linearly moving the substrate 210 (i.e., moving the substrate 210 up or down).

The driving unit 150 may be connected to the susceptor 140 and may move the susceptor 140 linearly. According to one or more embodiments, the driving unit 150 may include a cylinder connected to the susceptor 140. According to another embodiment, the driving unit 150 may include a ball screw connected to the susceptor 140 and a motor for rotating the ball screw. The driving unit 150 is not limited thereto and may include any device or any structure connected to the susceptor 140 such that the susceptor 140 may move linearly. However, for convenience of description, reference is made herein to embodiments wherein the driving unit 150 includes a cylinder.

The gas supply unit 161 may supply the reaction gas and the inert gas to the shower head 120. For example, the gas supply unit 161 may supply the reaction gas and the inert gas to the shower head 120 separately. Specifically, the gas supply unit 161 may supply at least one of the reaction gas and the inert gas according to a process of manufacturing the display device.

The cleaning unit 162 may be connected to the shower head 120 to supply a cleaning gas. The cleaning gas may be an inert gas such as He or the like. The cleaning unit 162 may include a remote plasma system (RPS) for generating plasma from the cleaning gas. As the RPS is the same as or similar to a general or typical RPS, a detailed description thereof is omitted.

The mask 171 may be located between the susceptor 140 and the shower head 120. The mask 171 may have at least one pattern part 171*a* through which the mixed gas passes. The at least one pattern part 171*a* may specify a portion wherein the mixed gas is deposited. For example, when a plurality of display devices are manufactured, each pattern part 171*a* may correspond to each display unit D. As another example, when one display device is manufactured, one pattern part 171*a* may correspond to a display unit D of the substrate 210.

The mask 171 may be seated on the mask fixing unit 172. The mask fixing unit 172 may be formed in a bracket form, a clamp form, or the like such that the mask 171 is seated on the mask fixing unit 172. In addition, the mask fixing unit 172 may be formed to move in various directions.

The vision unit 191 may be located outside the chamber 111. The vision unit 191 may photograph the mask 171 and the substrate 210. An image captured by the vision unit 191 may be transmitted to the control unit.

The exhaust unit 180 may discharge gases inside the chamber 111 to the outside. The exhaust unit 180 may include an exhaust pipe 181 connected to the chamber 111 and a pump 182 mounted on the exhaust pipe 181.

The control unit may be electrically connected to the power supply unit 132, the susceptor 140, the driving unit 150, the gas supply unit 161, the cleaning unit 162, the mask fixing unit 172, the vision unit 191, and the exhaust unit 180 to be able to individually (or separately) control the power supply unit 132, the susceptor 140, the driving unit 150, the gas supply unit 161, the cleaning unit 162, the mask fixing unit 172, the vision unit 191, and the exhaust unit 180.

The control unit may be a PC, a laptop computer, a portable terminal, a cellular phone, or the like. In one or more embodiments, the control unit may be a circuit board or the like. However, the control unit is not limited thereto and may have any form capable of controlling an operation of the apparatus 100.

Hereinafter, a method of manufacturing a display device by using the apparatus 100 is described. First, the substrate 210 on which the display unit D is formed may be supplied to the inside of the chamber 111 by a robot arm or the like. The exhaust unit 180 may maintain atmospheric pressure inside the chamber 111. In addition, the gate valve 112 may open the opening 111*a*. The lifter 141 may elevate upward to support the substrate 210.

After inserting and seating the substrate 210, the mask 171 may be inserted into the chamber 111 from the outside. Thereafter, the mask 171 may be seated on the mask fixing unit 172.

After inserting the substrate 210 and the mask 171 into the chamber 111, the exhaust unit 180 may maintain the pressure inside the chamber 111 to a low pressure similar to a vacuum. Then, the vision unit 191 may photograph locations of the substrate 210 and the mask 171 and transmit the captured image to the control unit. Specifically, the vision unit 191 may photograph alignment marks respectively formed on the substrate 210 and the mask 171 and transmit the captured image to the control unit.

The control unit may analyze the captured image to determine whether the mask 171 and the substrate 210 are aligned. If it is determined that the substrate 210 and the mask 171 are not aligned, the control unit may adjust the location of the substrate 210 or the mask 171 by controlling the lifter 141 or the mask fixing unit 172.

After completing the alignment, if it is determined that the locations of the substrate 210 and the mask 171 are aligned, the control unit may supply the reaction gas and the inert gas through the gas supply unit 161. In this case, the control unit may control the gas supply unit 161 to first spray the purge gas and then supply the reaction gas and the carrier gas, and may control the plasma generation unit 131 to generate plasma from the reaction gas and the carrier gas.

The plasma generated from the reaction gas and the carrier gas may be sprayed onto the substrate 210 through the shower head 120. In this case, the control unit may control the power supply unit 132 to adjust a frequency of a current to be applied to the plasma generation unit 131 so that the frequency is between about 27 MHz and about 42 MHz. In addition, the susceptor 140 may maintain a temperature of the substrate 210 at about 100° C. or less. In addition, a partial pressure ratio of silane in the mixed gas may be between about 30% and about 80%. If the partial pressure ratio of silane in the mixed gas is less than 30%, the generation of ionized reactive species of silane is too small, thereby decreasing a deposition speed, and if the partial pressure ratio of silane in the mixed gas exceeds 80%, the generation of ionized reactive species of silane is too large, thereby decreasing a deposition efficiency.

As described above, when a thin film is formed using the plasma while the temperature of the substrate 210 is maintained at about 100° C. or less, a portion of an organic material formed on the display unit D may be damaged due to a potential difference between charged particles because of the generation of the plasma. In addition, when the process described above is performed while maintaining the temperature of the substrate 210 at about 100° C. or less, the dissolution of silane may be accelerated by using a hydrogen (H) gas to maximize the radical formation of silane. However, when the H gas is used, a side effect caused by the H gas may occur.

Therefore, according to one or more embodiments, the side effect may be prevented by performing the process while maintaining the temperature of the substrate 210 at about 100° C. or less and without using the H gas.

When the deposition is performed while the frequency of the current is maintained as described above, an inorganic layer may be formed on the display unit D. In this case, a deposition speed of the inorganic layer may be about 0.45 μm/min or more. The deposition speed according to one or more embodiments of the present invention is at least two times faster than the typical deposition speed according to an existing apparatus.

When plasma density increases, collisions between particles may increase, thereby increasing the deposition speed. Herein, the plasma density may be proportional to a square of the frequency of the current. A current density between electrodes of the plasma generation unit 131 may also be proportional to a square of the frequency of the current.

As such, when the frequency of the current increases, the plasma density and the current density may also increase. When the plasma density increases, the deposition speed increases, the current density increases, and a potential difference formed by the plasma decreases. Thus, damage to the display unit D caused by the plasma may be prevented (or minimized).

In other words, when the temperature of the substrate 210 is about 100° C. or less as described above, the deposition speed is not influenced by the temperature of the substrate 210, and an impedance of the plasma may influence the deposition speed. In this case, the deposition speed may be inversely proportional to the impedance of the plasma, and thus, when the impedance of the plasma is minimized, the deposition speed may increase. Therefore, according to one or more embodiments, the impedance of the plasma may be minimized by decreasing the potential difference of the plasma to a half or less, and, by minimizing the impedance of the plasma, the deposition speed may increase two times or more relative to the deposition speed according to an existing apparatus.

Referring to FIG. 2, when power of the plasma generation unit 131 increases, the potential difference of the plasma decreases to about half of the potential difference as compared with the existing process. In addition, as compared with the existing process, an increasing speed of the potential difference of the plasma may be significantly slow along with the increase in the power of the power supply unit 132. The power of the power supply unit 132 may increase by changing the frequency of the current. Accordingly, the potential difference of the plasma may be formed low, and the current density may increase. Specifically, according to one or more embodiments, as compared with the existing process, a higher current density may be formed since the potential difference of the plasma is lower in a same power condition, and thus, more ionized active species may be formed and the deposition speed may increase by two times or more.

As shown in Table 1, below, the inorganic layer manufactured by using the apparatus 100 and the method of manufacturing a display device according to one or more embodiments of the present invention may be formed more densely than an inorganic layer manufactured by using an existing apparatus and an existing method.

According to one or more embodiments, without using H, a bond ratio of Si—H may decrease from the existing value of about 33.35% to about 25.71%. In addition, according to one or more embodiments, by generating more ionized active species (as compared to the ionized active species generated by the existing apparatus) by dissolving a silane gas, a bond ratio of Si-nitrogen (N) may increase from the typical value of about 55.53% to about 62.28%. In this case, the existing process uses a plasma chemical vapor deposition (CVD) method using about 13.56 MHz, and the present embodiment uses about 27 MHz.

TABLE 1

| Bonding | Bond ratio (%) | |
|---|---|---|
| | Existing process | Present embodiment |
| Si—N | 55.53 | 62.28 |
| Si—H | 33.35 | 25.71 |
| N—H | 11.12 | 12.01 |

Specifically, the inorganic layer may have a water vapor transmission ratio (WVTR) of about $5\times10^{-5}$ g/m$^2$ day or less. Thus, the WVTR of the inorganic layer may decrease about ten times or more relative to the WVTR of an inorganic layer formed according to an existing process.

After forming the inorganic layer through the process described above, an organic layer may be formed on the inorganic layer. Then an inorganic layer may be formed on the organic layer, and an organic layer may also be formed on the inorganic layer. In other words, the inorganic layer and the organic layer may be alternately and repeatedly stacked to form alternating layers.

Therefore, the apparatus 100 and the method of manufacturing a display device may deposit the inorganic layer at a faster speed (e.g., at least two times faster) at a low temperature as compared with the existing apparatus and the existing method. In addition, the apparatus 100 and the method of manufacturing a display device may protect the display unit D below the inorganic layer from external moisture, thus improving the life span of the display device.

Figure 3:
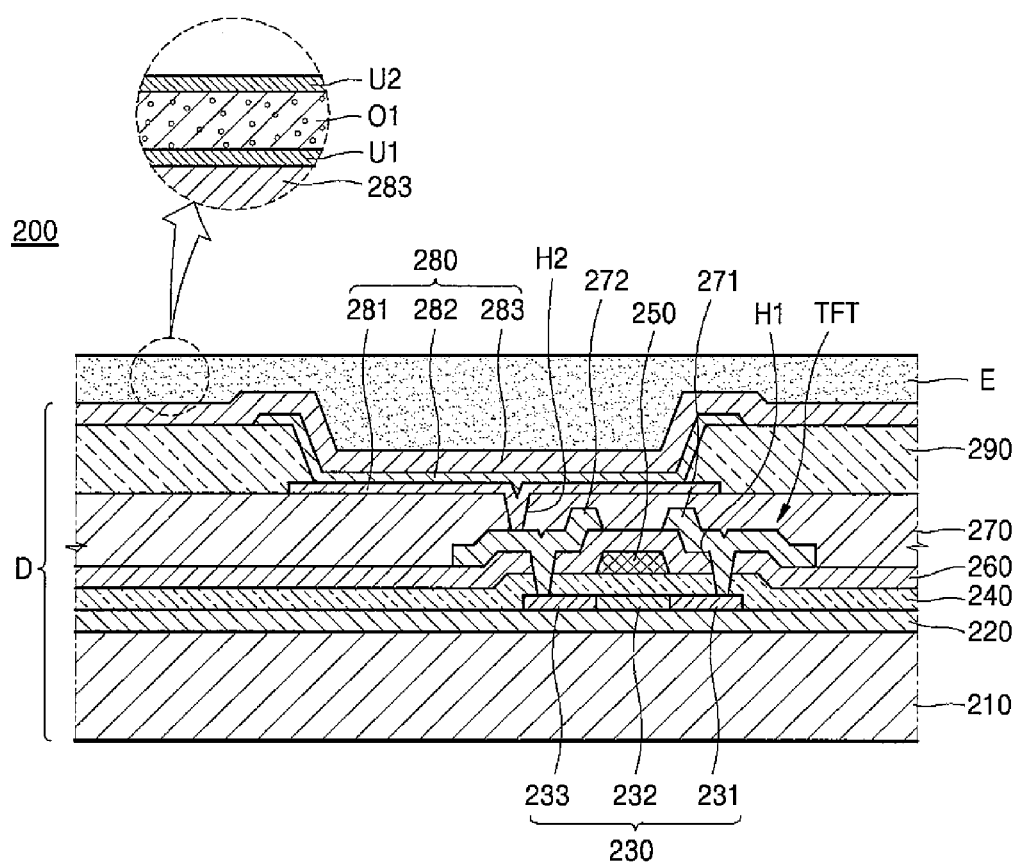
FIG. 3 is a cross-sectional side view of a portion of the display device manufactured by the apparatus of FIG. 1.
Figure 4:
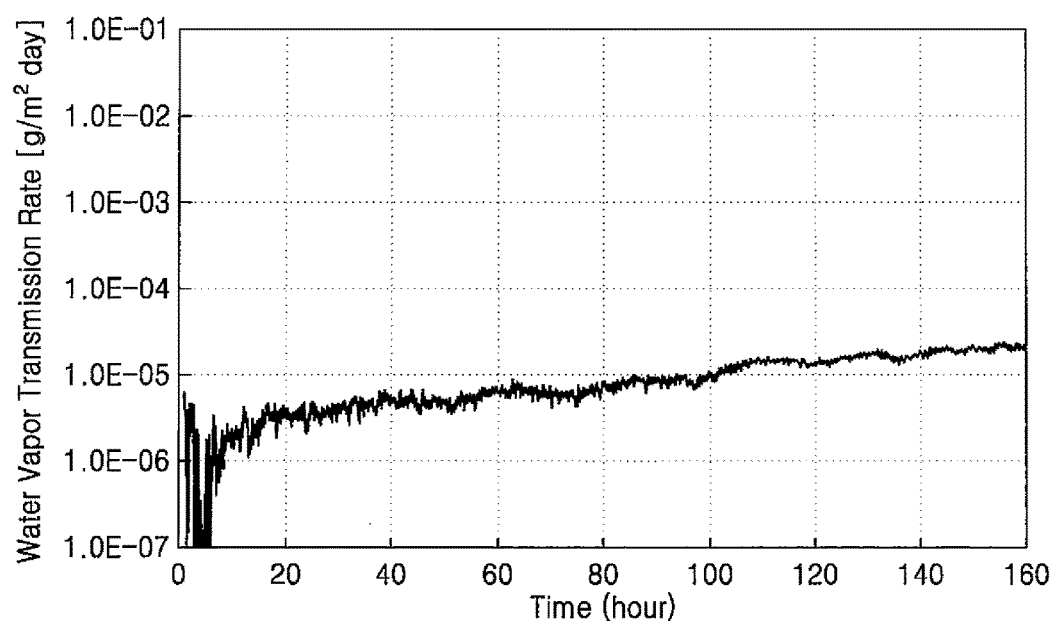
FIG. 4 is a graph illustrating a water vapor transmission characteristic of an inorganic layer in the display device of FIG. 3.

FIG. 3 is a cross-sectional side view of a portion of a display device 200 manufactured by the apparatus 100 of FIG. 1. FIG. 4 is a graph showing a water vapor transmission characteristic of an inorganic layer in the display device 200 of FIG. 3.

Referring to FIGS. 3 and 4, the display device 200 may include the substrate 210 and a display unit. In addition, the display device 200 may include a thin-film encapsulation layer E or an encapsulation substrate formed on the display unit. The encapsulation substrate is the same as or similar to that used for a general display device, and thus a detailed description thereof is omitted. For convenience of description, reference is made herein to embodiments wherein the display device 200 includes the thin-film encapsulation layer E.

The display unit may be formed on the substrate 210. The display unit may include a thin-film transistor TFT, a passivation layer 270 and an organic light emitting diode (OLED) 280. The passivation layer 270 may be formed to cover the display unit and the thin-film transistor TFT, and the OLED 280 may be formed on the passivation layer 270.

The substrate 210 may include a glass material. However, the substrate 210 is not necessarily limited thereto and may include a plastic material or a metallic material such as steel use stainless (SUS) or titanium (Ti). Alternatively, the substrate 210 may include polyimide (PI). For convenience of description, reference is made herein to embodiments wherein the substrate 210 includes a glass material.

A buffer layer 220 formed of an organic compound and/or an inorganic compound is formed on an upper surface of the substrate 210. The buffer layer 220 may be formed of silicon oxide ($SiO_x$) (x≥1) or silicon nitride ($SiN_x$) (x≥1).

An active layer 230 arranged in a predetermined pattern is formed on the buffer layer 220 and is buried (or covered) by a gate insulating layer 240. The active layer 230 includes a source region 231 and a drain region 233 and further includes a channel region 232 therebetween.

The active layer 230 may be formed to include various materials. For example, the active layer 230 may include an inorganic semiconductor material such as amorphous silicon or crystalline silicon. As another example, the active layer 230 may include an oxide semiconductor. As another example, the active layer 230 may include an organic semiconductor material. However, for convenience of description reference is made herein to embodiments wherein the active layer 230 includes amorphous silicon.

The active layer 230 may be formed by forming an amorphous silicon layer on the buffer layer 220, crystallizing the amorphous silicon layer to form a polycrystalline silicon layer, and patterning the polycrystalline silicon layer. The source region 231 and the drain region 233 of the active layer 230 are doped with impurities according to a thin-film transistor type, such as a driving thin-film transistor, a switching thin-film transistor, or the like.

A gate electrode 250 facing the active layer 230 and an interlayer insulating layer 260 which buries the gate electrode 250 are formed on an upper surface of the gate insulating layer 240.

Contact holes H1 are formed in the interlayer insulating layer 260 and the gate insulating layer 240, and a source electrode 271 and a drain electrode 272 are formed on the interlayer insulating layer 260 such that the source electrode 271 and the drain electrode 272 contact the source region 231 and the drain region 233, respectively.

The passivation layer 270 is formed on the thin-film transistor TFT formed as described above, and a pixel electrode 281 of the OLED 280 is formed on the passivation layer 270. The pixel electrode 281 contacts the drain electrode 272 of the thin-film transistor TFT through a via hole H2 formed in the passivation layer 270. The passivation layer 270 may be formed of an inorganic material and/or an organic material and in a single layer or two or more layers, wherein the passivation layer 270 may be formed as a planarization layer such that an upper surface thereof is planarized regardless of the unevenness of a lower layer or formed uneven along the unevenness of the lower layer. The passivation layer 270 may be formed of a transparent insulator so that a resonance effect is achieved.

After forming the pixel electrode 281 on the passivation layer 270, a pixel-defining layer 290 is formed of an organic material and/or an inorganic material such that the pixel-defining layer 290 covers at least a portion of the pixel electrode 281 and the passivation layer 270 but exposes at least a portion of the pixel electrode 281 therethrough.

An intermediate layer 282 and an opposite electrode 283 are formed on at least the pixel electrode 281.

In one or more embodiments, the pixel electrode 281 may function as an anode, and the opposite electrode 283 may function as a cathode. In one or more embodiments, the pixel electrode 281 may function as a cathode and the opposite electrode 283 may function as an anode.

The pixel electrode 281 and the opposite electrode 283 are insulated from each other by the intermediate layer 282, and when voltages of different polarities are applied to the intermediate layer 282, an organic emission layer emits light.

The intermediate layer 282 may include the organic emission layer. Alternatively, the intermediate layer 282 may include the organic emission layer and may further include at least one selected from the group consisting of a hole injection layer (HIL), a hole transport layer (HTL), an electron transport layer (ETL), and an electron injection layer (EIL).

One unit pixel includes a plurality of sub-pixels R, G and B, and the plurality of sub-pixels R, G and B may emit light of various colors. For example, the unit pixel may include the plurality of sub-pixels R, G and B that respectively emit red light, green light, and blue light, or a plurality of sub-pixels that respectively emit red light, green light, blue light, and white light.

The thin-film encapsulation layer E may include a plurality of inorganic layers or may include an inorganic layer and an organic layer. The organic layer of the thin-film encapsulation layer E is formed of a polymer and may be a single-layer film or a multi-layer film formed of polyethylene terephthalate (PET), PI, polycarbonate (PC), epoxy, polyethylene, or polyacrylate. Further, the organic layer may be formed of polyacrylate, and in detail, the organic layer may include a polymerized monomer composition including a diacrylate-based monomer and a triacrylate-based monomer. The monomer composition may further include a monoacrylate-based monomer. The monomer composition may further include a well-known photoinitiator, such as TPO, but is not limited thereto.

The inorganic layer of the thin-film encapsulation layer E may be a single-layer film or a multi-layer film including a metal oxide or a metal nitride. For example, the inorganic layer may include $SiN_x$, $Al_2O_3$, $SiO_2$, or $TiO_2$.

The uppermost layer exposed to the outside in the thin-film encapsulation layer E may be formed of an inorganic layer to prevent infiltration of moisture to the OLED 280.

The thin-film encapsulation layer E may include at least one sandwich structure in which at least one organic layer is interposed between at least two inorganic layers. As another example, the thin-film encapsulation layer E may include at least one sandwich structure in which at least one inorganic layer is interposed between at least two organic layers. As another example, the thin-film encapsulation layer E may include a sandwich structure in which at least one organic layer is interposed between at least two inorganic layers and a sandwich structure in which at least one inorganic layer is interposed between at least two organic layers.

The thin-film encapsulation layer E may sequentially include a first inorganic layer U1, a first organic layer O1, and a second inorganic layer U2 from an upper part of the OLED 280.

As another example, the thin-film encapsulation layer E may sequentially include the first inorganic layer U1, the first organic layer O1, the second inorganic layer U2, a second organic layer, and a third inorganic layer from the upper part of the OLED 280.

As another example, the thin-film encapsulation layer E may sequentially include the first inorganic layer U1, the first organic layer O1, the second inorganic layer U2, the second organic layer, the third inorganic layer, a third organic layer, and a fourth inorganic layer from the upper part of the OLED 280.

A halogenated metal layer including lithium fluoride (LiF) may be further included between the OLED 280 and the first inorganic layer. The halogenated metal layer may prevent the OLED 280 from being damaged when the first inorganic layer is formed by a sputtering method.

The first organic layer may have a smaller area than the second inorganic layer, and the second organic layer may also have a smaller area than the third inorganic layer.

For convenience of description, reference is made herein to embodiments wherein the thin-film encapsulation layer E includes the first inorganic layer U1, the first organic layer O1, and the second inorganic layer U2.

The first inorganic layer U1 and the second inorganic layer U2 may be manufactured by the apparatus 100 and the method of manufacturing a display device, which have been described with reference to FIGS. 1 and 2. Since the first inorganic layer U1 and the second inorganic layer U2 are the same or similar to each other, the first inorganic layer U1 is described below for convenience of description.

The first inorganic layer U1 formed as described above may have a WVTR of $5 \times 10^{-5}$ g/m² day or less as described above. Therefore, the display device 200 has a lower WVTR than the existing display device, and thus, the display unit D may be effectively protected from external moisture.

The first inorganic layer U1 may have a refractive index of between about 1.8 and about 1.88. In addition, the first inorganic layer U1 may have an inorganic layer transmission rate of about 90% or more at 450 nm. Therefore, as compared to an existing display device, the display device 200 has a substantially similar transmission rate and refractive index, and thus, the display device 200 may realize the same image quality as the existing display device.

The first inorganic layer U1 may have a stress of about −200 MPa to about 200 MPa. Therefore, the display device 200 has a similar stress as compared to an existing display device, and thus, the display device 200 may realize the same strength as the existing display device.

In addition, the first inorganic layer U1 may have a bond ratio of Si—N which is about 60% or more and a bond ratio of Si—H which is about 30% or less. Since the bond ratio of Si—N is about 60% or more, the first inorganic layer U1 may be formed more densely than the inorganic layer of the existing display device. Therefore, the display device 200 may have an improved MVTR as compared to the existing display device.

As described above, an apparatus and method for manufacturing a display device having an inorganic layer for minimizing the infiltration of moisture may be formed according to one or more of the above exemplary embodiments.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A method of manufacturing a display device, the method comprising:
   forming a display unit on a substrate;
   seating and aligning the substrate on a susceptor inside a chamber;
   linearly moving the substrate to adjust a gap between the substrate and a mask;
   and
   forming an inorganic layer on the display unit by spraying a plasma mixed gas onto the display unit through a shower head,
   wherein the shower head includes a plasma generation unit for forming the plasma the mixed gas, and a frequency of a current of power supplied to the plasma generation unit is between about 27 MHz and about 42 MHz,
   wherein a bond ratio of N—H in the inorganic layer is 10% or less,
   wherein a water vapor transmission rate (WVTR) of the inorganic layer is $5 \times 10^{-5}$ g/m² day or less due to a fast deposition speed of the inorganic layer of 0.45 μm/min or greater.

2. The method of claim 1, wherein a partial pressure ratio of silane in the mixed gas is between about 30% and about 80%.

3. The method of claim 1, wherein a temperature of the substrate is maintained at about 100° C. or less.

4. The method of claim 1, wherein a deposition speed of the inorganic layer is about 0.45 μm/min or greater.

5. The method of claim 1, wherein a refractive index of the inorganic layer is between about 1.8 and about 1.88.

6. The method of claim 1, wherein a transmission rate of the inorganic layer at 450 nm is about 90% or greater.

7. The method of claim 1, wherein a stress of the inorganic layer is between about −200 MPa and about 200 MPa.

8. The method of claim 1, wherein a bond ratio of silicon (Si)-nitride (N) in the inorganic layer is about 60% or greater, and a bond ratio of Si-hydrogen (H) is about 30% or less.

9. The method of claim 1, further comprising forming an organic layer on the inorganic layer.

10. The method of claim 9, wherein the forming of the inorganic layer and the forming of the organic layer are repeatedly performed to form alternating layers.

* * * * *